_United States Patent_ [19]

Chong et al.

[11] Patent Number: 4,978,959
[45] Date of Patent: Dec. 18, 1990

[54] ANALOG TO DIGITAL CONVERTER, A DIGITAL TO ANALOG CONVERTER AND AN OPERATIONAL AMPLIFIER THEREFOR

[75] Inventors: Chu P. Chong; Kenneth C. Smith, both of Toronto; Zvonko G. Vranesic, Islington, all of Canada

[73] Assignee: University of Toronto Innovations Foundation, Canada

[21] Appl. No.: 317,157

[22] Filed: Feb. 27, 1989

Related U.S. Application Data

[63] Continuation-in-part of Ser. No. 107,365, Oct. 8, 1987, abandoned.

[51] Int. Cl.[5] ............... H03M 1/44; H03M 1/72; H03F 3/45
[52] U.S. Cl. ............... 341/161; 341/127; 341/135; 341/136; 341/144; 341/146; 341/158; 341/162; 330/252; 330/253
[58] Field of Search ............... 341/126, 127, 133, 135, 341/136, 144, 145, 146, 155, 156, 158, 161, 162; 330/252, 253, 254, 255, 257, 260, 1 R

[56] References Cited

U.S. PATENT DOCUMENTS

| | | | |
|---|---|---|---|
| 3,643,253 | 2/1972 | Blank et al. | 341/136 |
| 4,333,058 | 6/1982 | Hoover | 330/253 |
| 4,377,789 | 3/1983 | Hoover | 330/257 |
| 4,435,685 | 3/1984 | Eckert et al. | 330/252 |
| 4,555,673 | 11/1985 | Huijsing et al. | 330/252 |
| 4,593,268 | 6/1986 | Blauschild | 341/162 |
| 4,611,196 | 9/1986 | Fernandez | 341/158 |
| 4,635,038 | 1/1987 | Wincn | 341/136 |
| 4,667,180 | 5/1987 | Robinson | 341/155 |
| 4,745,394 | 5/1988 | Cornett | 341/158 |
| 4,806,792 | 2/1989 | Simmons | 330/252 |

FOREIGN PATENT DOCUMENTS

| | | | |
|---|---|---|---|
| 54-108557 | 8/1979 | Japan | 330/253 |
| 55-35542 | 3/1980 | Japan | 330/253 |
| 59-156011 | 9/1984 | Japan | 330/253 |
| 63-276308 | 11/1988 | Japan | 330/252 |

_Primary Examiner_—William M. Shoop, Jr.
_Assistant Examiner_—Howard L. Williams
_Attorney, Agent, or Firm_—Thomas A. O'Rourke

[57] ABSTRACT

An operational amplifier is provided and includes at least two input terminals of one polarity and another input terminal of the opposite polarity. The amplifier includes an amplifying portion which comprises a differential section for receiving input signals applied to the input terminals. The differential section includes at least two differential amplifiers which form difference signals from the input signals. A summing section receives the difference signals and forms a sum result therefrom. A multiplying section provides an amplification gain to the sum result to form an output signal of desired gain. The amplifier is also provided with a feedback for applying an input signal to one of the input terminals, the output signal. The amplifier can be configured to provide amplification gains of 2, ½, −1 and 1. In view of the amplification gains equal to 2 and ½ respectively, there is also provided an analog to digital converter and a digital to analog converter both of which comprise a cascaded series of operational amplifiers.

51 Claims, 9 Drawing Sheets

ANALOG TO DIGITAL CONVERTER, A DIGITAL TO ANALOG CONVERTER AND AN OPERATIONAL AMPLIFIER THEREFOR

The present invention relates to an operational amplifier and in particular to an operational amplifier for use in digital to analog and analog to digital conversion.

Operational amplifiers (op-amps) are well known in the art and used in a variety of applications whenever input signal amplification is required. Conventional op-amps receive input signals which are applied to a pair of input terminals and provide therefrom an output signal of desired gain. Internally, the op-amps generally include a plurality of coupled transistors as well as a number of resistive and capacitive components. To generate the desired gain, the typical op-amp is provided with an external resistive feedback line as well as external resistive elements coupled to the input terminals thereof. However, a problem exists in that when forming these op-amps using integrated circuit technology, a large silicon area is required to form the external passive components as well as the internal passive components. Furthermore, it is extremely difficult to manufacture the passive components with a high degree of accuracy, and thus, the gain of these op-amps cannot be controlled to within small tolerances.

Traditionally when using op-amps in digital to analog (D to A) conversion, a single op-amp having a resistive feedback loop is connected in series to a parallel resistive ladder network. Each of the parallel resistive elements is connected to the same input terminal of the op-amp via a number of switches and is associated with one bit of the binary word to be converted. The resistive elements are designed such that each successive parallel resistive element provides to the input terminal, one-half of the current of the previous resistive element. When the op-amp receives a binary value that is to be converted to an analog signal, the appropriate switches connecting the resistive elements that are associated with binary bits having a binary value equal to "1" are closed thereby providing a current to the op-amp. The op-amp receives the current and in turn forms an analog voltage output signal that corresponds to the input binary value.

However, a similar problem exists in that when attempting to manufacture the D to A converter using VLSI, the resistive ladder requires a large silicon area. The same problem exists when using operational amplifiers in analog to digital (A to D) conversion, since traditional A to D converters use resistive or capacitive networks coupled to successive approximation registers via comparators to convert the data from analog to digital form.

It is therefore an object of the present invention to obviate or mitigate the above disadvantages by providing a novel operational amplifier.

According to the present invention there is provided an operational amplifier comprising:

at least two input terminals of one polarity and another input terminal of the opposite polarity, each of said input terminals for receiving an input signal;

an amplifying portion receiving said input signals and performing operations thereon to form an output signal of desired gain without requiring external passive components;

feedback means for applying as an input signal to one of said input terminals, said output signal, said amplifying portion including:

a differential section receiving said input signals and forming therefrom at least two difference signals; and logic means receiving said difference signals and performing operations thereon to provide said output signal, said output signal being equivalent to the sum of said difference signals factored by a gain.

Preferably, the logic means includes a summing section receiving said difference signals and forming therefrom a sum result and an amplification means for providing an amplification gain to the sum result thereby forming the output signal.

Preferably, the operational amplifier can be formed having two different configurations by altering the connection of the summing section to the differential section and by altering the connection of the feedback means. The first configuration provides gains of 1/N and 1 and the second configuration provides gains of N, −1 and 1 wherein N is greater or equal to 2 and is equal to the number of differential amplifiers provided in the differential section. The second op-amp configuration conceptionally differs from the first in that the second configuration is equivalent to the first configuration having the output thereof conveyed through an additional inverting amplifier. However, the second configuration has the advantage of performing the inversion of the input without requiring any additional components.

Furthermore, it is preferred that the operational amplifier be formed from a number of coupled transistors and a single capacitive component, the capacitance of which can be achieved using either a passive component or a MOS gate to channel capacitance, thereby facilitating the manufacturing process using integrated circuit technology.

In another aspect of the present invention there is provided a digital to analog converter for converting an N digit number into an analog signal comprising:

a reference source for providing a reference signal;

a value source for providing a value signal for each of said N digits, said value signals being dependent on the value of said digit; and at least N number of serially connected operational amplifiers receiving first, second and third input signals, each of said amplifiers being associated with one of said bits and providing an output signal equal to the sum of said first and second input signals factored by 1/X wherein X is an integer greater or equal to 2, said output signal being applied to the preceding amplifier via an output line, each of said amplifiers comprising:

at least first and second non-inverting input terminals and a third inverting input terminal, said first terminal being connected to said value source and said second terminal being connected to said output line, except the second terminal of said first amplifier which receives said reference signal;

a differential section receiving said first, second and third input signals and forming therefrom a pair of difference signals; and logic means receiving said difference signals and performing operations thereon to provide said output signal, said output signal being equivalent to the sum of said difference signals factored by a gain; and feedback means for connecting said output line to said third terminal.

In yet another aspect of the present invention there is provided a sign digit polarity control means for use in a digital to analog converter, said sign digit polarity control means for altering the polarity of an analog signal in accordance with the sign of the corresponding binary word to form a polarized analog signal comprising:

an operational amplifier having first and second inverting input terminals and a third noninverting input terminal, each of said terminals for receiving input signals, one of said first and second input terminals receiving said analog signal;

switch means responsive to a control signal for providing said analog signal to said third input terminal, said amplifier comprising:

an amplifying portion receiving said input signals and forming therefrom said polarized analog signal, said polarized analog signal being substantially equal to the difference between twice said third input signal and said analog signal applied to said one of said first and second input terminals;

feedback means for applying as an input signal to the other of said first and second input terminals, said output signal, said amplifying portion comprising:

a differential section receiving said input signals and forming therefrom a pair of difference signals;

a summing section for forming a sum result from said difference signals; and amplification means for providing an amplification gain to said sum result to form said polarized analog signal.

In yet another aspect of the present invention there is provided a sequential analog to digital converter for converting an analog signal into an N digit binary word comprising:

a reference source for providing a reference signal;

at least N number of cascaded interconnected multiplying stages receiving stage input signals and forming therefrom stage output signals, each multiplying stage of which receives as a stage input signal, the stage output signal of the preceding stage, except said first multiplying stage which receives said analog signal, each of said N multiplying stages also receiving said reference signal and generating from said input signals, said stage output signals, said stage output signals being equivalent to the difference between said stage input signal and said reference signal factored by X wherein X is a positive integer greater or equal to 2, the polarity of each of said stage output signals determining the value of one digit of said binary word;

comparing means connected in parallel with each of said stages for comparing said stage output signals with a standard value signal to determine the polarity thereof;

register means for forming said binary digits from said detected polarity; and switch means responsive to control signals for removing said reference source and said comparing means from said multiplying stages to alter the stage signal output thereof if the stage output signal is less than said standard value signal, said multiplying stages including at least one operational amplifier, said amplifier comprising:

at least first and second inverting input terminals and a third non-inverting input terminal, each of said terminals for receiving an input signal, a differential section receiving said input signals and forming therefrom a pair of difference signals;

logic means receiving said difference signals and performing operations thereon to provide said output signal, said output signal being equivalent to the sum of said difference signals factored by a gain; and feedback means for applying as an input signal to one of said first and second terminals, said stage output signal.

Embodiments of the present invention will now be described by way of example only with reference to the accompanying drawings in which:

FIG. 1b is a functional block diagram of a portion of the amplifier shown in FIG. 1a;

Figure 1A:
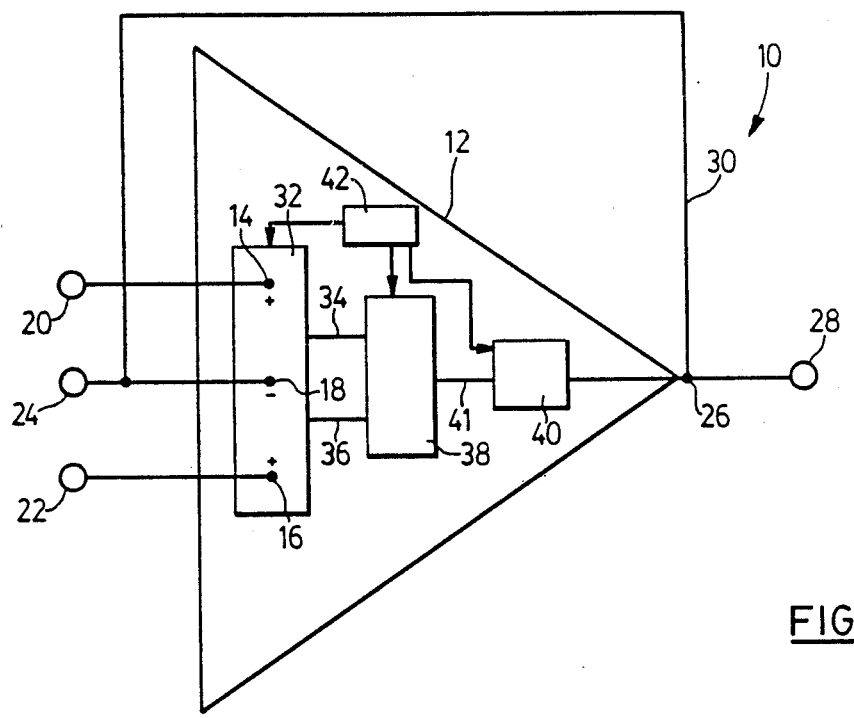
FIG. 1a is a functional block diagram of an operational amplifier.
Figure 1B:
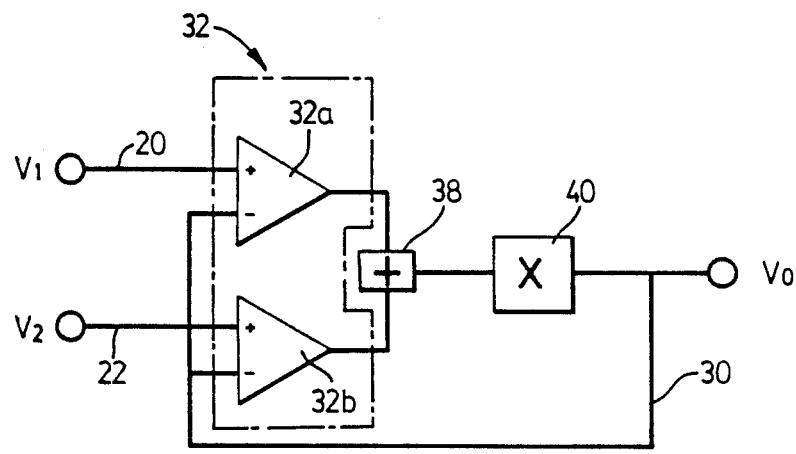
Figure 2:
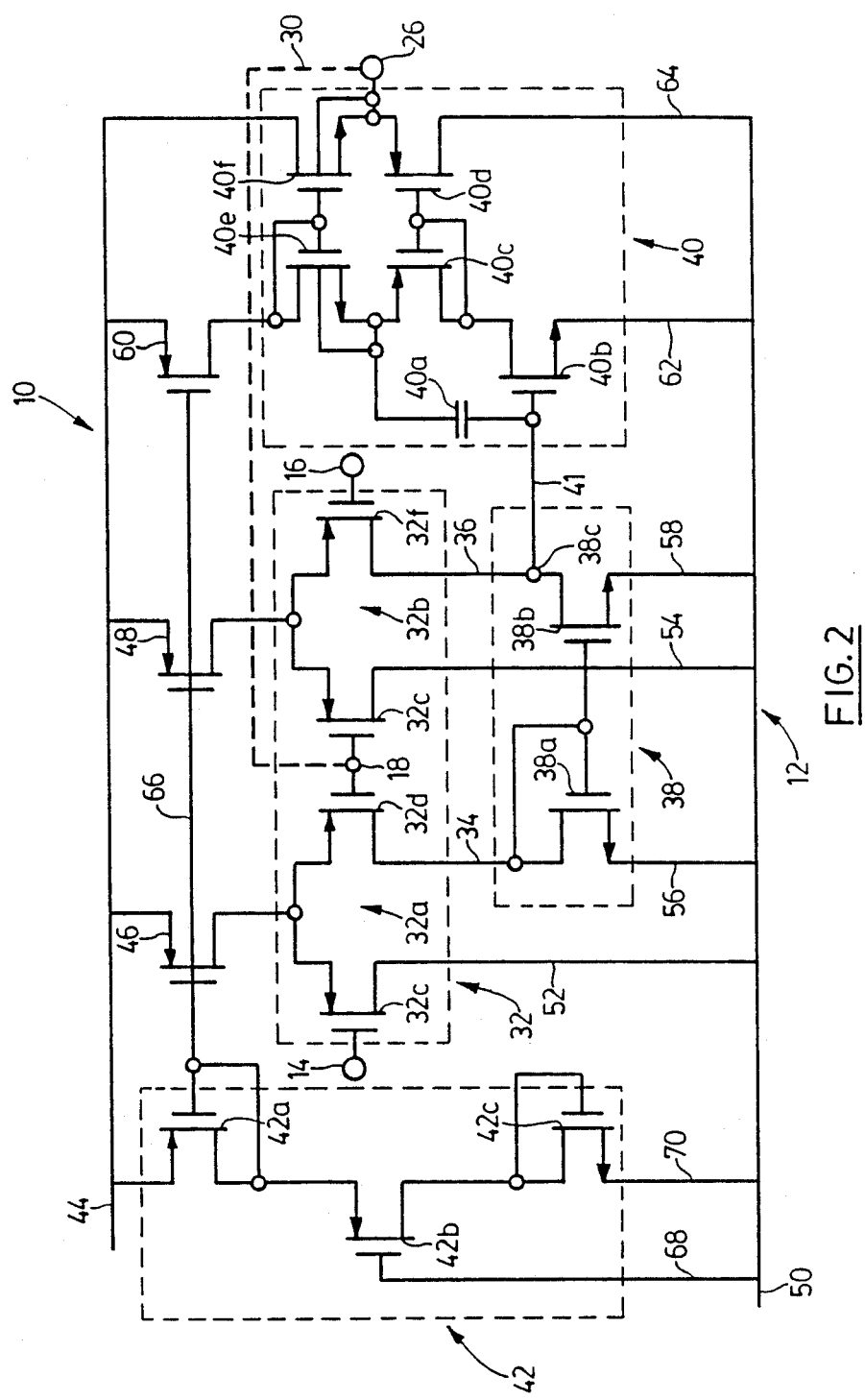
FIG. 2 is detailed schematic circuit diagram of the amplifier illustrated in FIG. 1.

Referring to FIGS. 1a, 1b and 2, an operational amplifier (op-amp) 10 is shown having an amplifying portion 12 provided with a pair of noninverting input terminals 14 and 16 and a single inverting input terminal 18. Connected to the input terminals 14, 16 and 18 are input lines 20, 22 and 24 respectively which receive the input signals to be scaled. Amplifying portion 12 is also provided with an output terminal 26 which is connected to an output line 28 to allow the output signal of the op-amp 10 to be extracted or applied to other circuitry. The output terminal 26 is also connected to the inverting input terminal 18 via a low resistance feedback line 30, to stabilize the amplification gain of the op-amp 10.

Amplifying portion 12 includes a differential section 32 which receives the three input signals applied to input lines 20, 22 and 24 via input terminals 14, 16 and 18 and forms therefrom a pair of difference signals which are conveyed to conductors 34 and 36 respectively. Connected to conductors 34 and 36 is a summing section 38 which forms a sum result from the difference signals. Summing section 38 applies the sum result to a multiplying section 40 via a conductor 41, wherein the result is amplified by the desired gain. Multiplying section 40 also exhibits the desired low output terminal impedance characteristics.

Amplifying section 12 is also provided with a control section 42 which supplies a constant drive current to the differential section 32 and the multiplying section 40.

As best seen in FIGS. 1b and 2, differential section 32 comprises two differential amplifiers (diff-amps) 32a and 32b each of which comprises two coupled complementary MOS (CMOS) transistors 32c to 32f, the operation of which is well known in the art. CMOS transistors 32c and 32d which form diff-amp 32a are matched and thus, are substantially identical in channel width and gain characteristics. Similarly, transistors 32e and 32f which form diff-amp 32b are matched. In order to provide equal channels in both diff-amps, diff-amps 32a and 32b are matched and thus, transistors 32c to 32f are manufactured to be substantially identical.

The diff-amps 32a and 32b are connected to a positive power supply 44 via constant current drivers 46 and 48 respectively, each driver of which comprises a single CMOS transistor. Since both diff-amps are designed to be substantially identical and hence, to exhibit the same characteristics, it is desired that they are supplied with substantially identical driving currents. Thus, the transistors 46 and 48 forming the two current drivers are matched to achieve this desired result. The diff-amps are also connected to a negative power supply 50 through conductors 52 and 54 respectively.

Summing section 38 comprises a pair of matched CMOS transistors 38a and 38b which are arranged in a conventional manner to form a current mirror. Summing section 38 is coupled to differential section 32 via conductors 34 and 36 respectively. The summing section 38 provides an output signal equivalent to the difference of the two difference signals and applies the signal to the multiplying section 40, through an output node 38c. Transistors 38a and 38b are also connected to the negative power supply 50 via conductors 56 and 58.

Multiplying section 40 which receives the sum result comprises a single capacitor 40a and a plurality of CMOS transistors 40b to 40f. Transistors 40b to 40d are arranged in a conventional manner to provide the desired amplification gain to the sum result signal. Furthermore, transistors 40e and 40f and capacitor 40a are coupled in a known manner to transistors 40b to 40d to provide compensation thereto, thereby stabilizing the gain of the multiplying section 40. Multiplying section 40 is also connected to the positive power supply 44 via a constant current driver 60 and to the negative power supply 50 via conductors 62 and 64. As mentioned previously, the output signal of the multiplying section 40 is applied to output terminal 26 wherein it is conveyed to input terminal 18 via low resistance feedback path 30.

Control section 42 comprises three CMOS transistors 42a, 42b and 42c and provides a constant voltage input to each of the three current drivers 46, 48 and 60 via conductor 66. Transistor 42a is connected to conductor 66 and the positive power supply 44 whilst transistors 42b and 42c are connected to the negative power supply 50 via conductors 68 and 70 respectively.

The operation of the op-amp 10 will now be described. Input voltage signals $V_1$ and $V_2$ are applied to input lines 20 and 22 respectively and conveyed to diff-amps 32a and 32b via non-inverting terminals 14 and 16 respectively. Each diff-amp also receives the output voltage signal $V_0$ from the low resistance feedback line 30 on its inverting terminal 18.

Diff-amp 32a forms from the input signals $V_1$ and $V_0$, an output current or difference signal $d_1$ proportional to the difference of the input voltages and defined by the equation:

$$d_1 = (V_1 - V_0) * A' \qquad (1)$$

wherein $A'$ is the gain of the diff-amp 32a provided that both channels defined by diff-amps 32a and 32b have equal gain and the magnitude of which is generally small. Similarly, diff-amp 32b forms from the input signals $V_2$ and $V_0$, an output current or difference signal $d_2$ defined by the equation:

$$d_2 = -(V_2 - V_0) * A' \qquad (2)$$

The difference signal $d_1$ is applied to transistor 38a in summing section 38 via conductor 34 and signal $d_2$ is applied to transistor 38b via conductor 36. Transistors 38a and 38b subtract the difference signals $d_1$ and $d_2$ and form an output voltage or sum result $S_r$ at node 38c defined by the equation:

$$S_r = (V_1 - V_0) * A' + (V_2 - V_0) * A' \qquad (3)$$

The voltage or sum result $S_r$ formed at node 38c is applied to the multiplying section 40 via conductor 41.

Multiplying section 40 receives the sum result and amplifies the result by a predetermined gain A to form the output signal $V_0$. The gain A is selected to be much larger than the differential amplifier gain $A'$. As mentioned previously, the output signal $V_0$ of the multiplying section 40 is applied to output terminal 26 wherein it is conveyed back to input terminal 18. Thus, the output voltage of the op-amp 10 is defined by the equation:

$$V_0 = (V_1 - V_0) * A * A' + (V_2 - V_0) * A * A' \qquad (4)$$

wherein the gain of the output signal $V_0$ is determined primarily by the multiplication section gain A, since A is much larger than the diff-amp gain $A'$ which as mentioned previously is substantially equal to unity. As can be seen, equation 4 can be arranged to form the following result assuming that $A * A' = A$.

$$(V_1 + V_2) * A = V_0 + 2V_0 * A \qquad (5)$$

Now if the open-loop gain A is much greater than unity (i.e. $A >> 1$), then equation 5 is substantially equivalent to:

$$V_0 = \frac{V_1 + V_2}{2} \qquad (6)$$

Thus, if either one of input terminals 20 or 22 is connected to ground (i.e. $V_2$ or $V_1$ is equal to zero), the output voltage signal $V_0$ will be equal to one-half of the other input voltage signal. It should be noted that it is not possible to achieve the result of equation 6 using a conventional two input terminal operational amplifier without the use of a number of passive components. Furthermore, if the input signals $V_1$ and $V_2$ are substantially identical, the op-amp 10 will produce an output signal $V_0$ equal to one of the input signals $V_1$ and $V_2$. Thus, the op-amp 10 can provide amplification gains equal to one-half and unity.

Figure 1C:
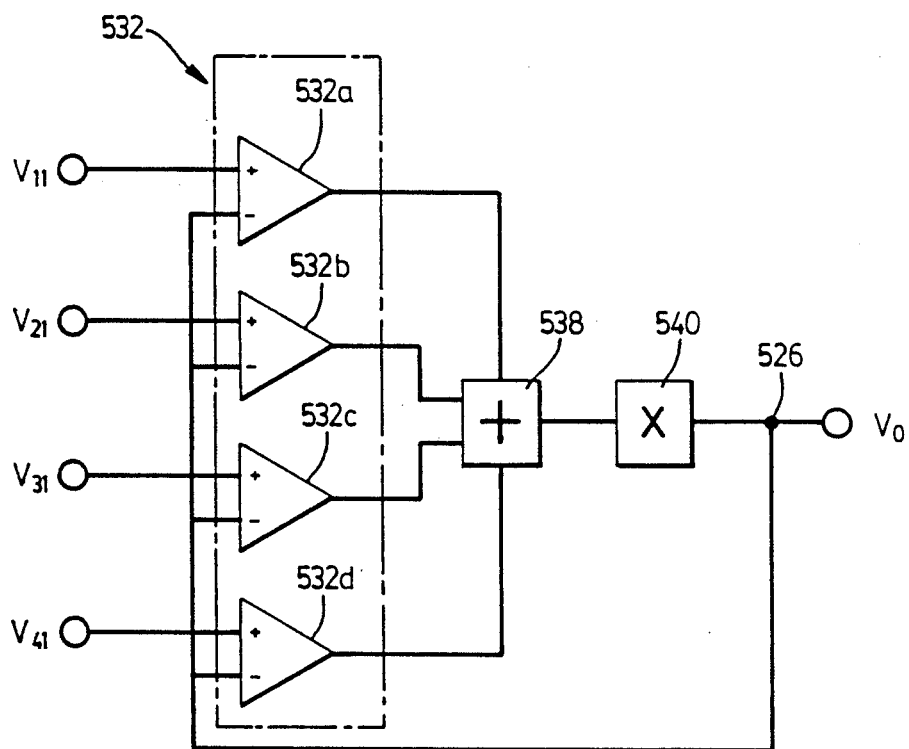
FIG. 1c is a functional block diagram of another embodiment of the portion shown in FIG. 1b.

Referring not to FIG. 1c, another embodiment of the present amplifier is shown. In this embodiment like reference, numerals will be used to indicate like components with "500" added for clarity. In this embodiment, the differential section 532 includes four differential amplifiers 532a to 532d as opposed to two differential amplifiers shown in the previous embodiment. The inverting terminals of the four differential amplifiers are interconnected and extend to the output terminal 526 via a low resistance feedback line 530. The non-inverting terminal of each differential amplifier receives one of four input signals $V_{11}$, $V_{21}$, $V_{31}$ and $V_{41}$ respectively.

The output of each differential amplifier is combined to form a sum result via the summing section 538. The sum result is in turn supplied with an appropriate gain via multiplying section 540 prior to forming the output signal $V_0$. The output signal $V_0$ is then applied to the output terminal and to the feedback line 530.

Since the output of each differential amplifier is the difference between the input signals received on its terminals, the output signals generated by the four differential amplifiers 532a to 532d are $(V_{11}-V_0)$, $(V_{21}-V_0)$, $(V_{31}-V_0)$ and $(V_{41}-V_0)$ respectively. Thus, the sum result formed by combining the output of the differential amplifiers is equivalent to $(V_{11}+V_{21}+V_{31}+V_{41})-4V_0$. By providing a sufficient gain to the sum result, the output signal of this amplifier 510 can be expressed in the form:

$$V_0 = \frac{V_{11} + V_{21} + V_{31} + V_{41}}{4}$$

As should be realized, this amplifier performs an averaging operation on the input signals received on the non-inverting terminals of the differential amplifiers. Thus, it should be realized that the present amplifier can perform an averaging operation on 2N input signals where N is a positive integer by providing a differential amplifier for each input signal. Each input signal is then supplied to the noninverting terminal of the amplifier whilst the inverting terminal of each amplifier is interconnected and connected to the feedback line.

With respect to using odd numbers of differential amplifiers to provide the above-mentioned averaging on 2N+1 input signals, the above-mentioned amplifier works satisfactorily to provide an output signal close to an average of the input signals provided the input signals are small and the number of input signals to be averaged is not too large. If the input signals attain large magnitudes and the number of input signals to be processed approaches a large number, the amplifier will provide an output signal. However, the output signal will not be simply an average value of the input signals but will be defined by a non-linear equation.

Accordingly, when using these op-amps to form averages, the output of the operational amplifier can be chosen to provide an output signal $V_0$ of the form:

$$V_0 = \frac{\sum_{i=2}^{N} V(i)}{N}$$

wherein N is greater or equal to 2 and is equal to the number of input signals to be averaged by providing the N number of differential amplifiers.

Figure 3:
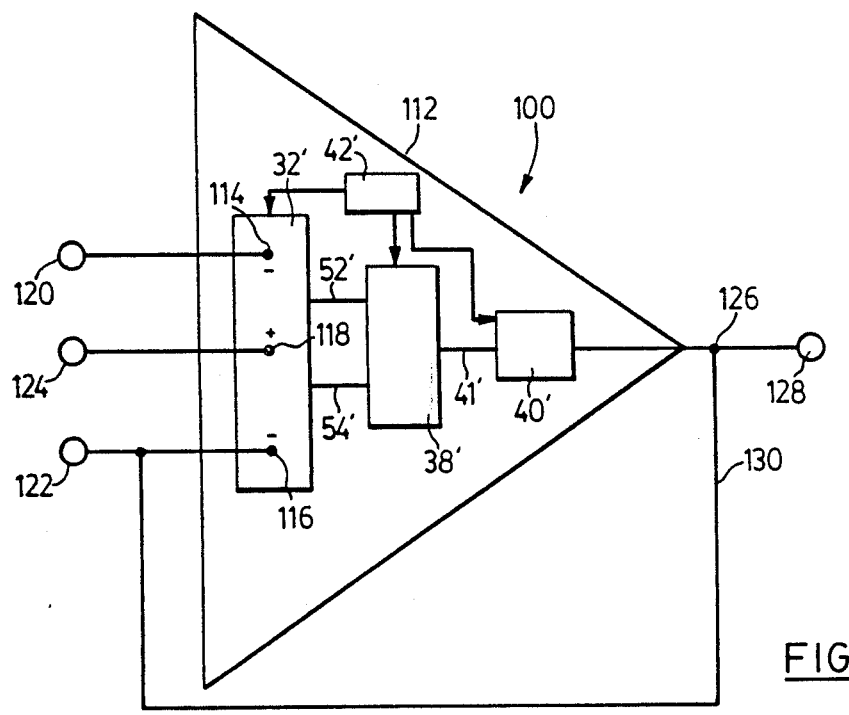
FIG. 3 is a functional block diagram of another operational amplifier.

Referring now to FIG. 3, an operational amplifier 100 is shown, this op-amp being complementary to the op-amp illustrated in FIG. 1. Similar to op-amp 10, op-amp 100 is provided with three input terminals 114, 116 and 118. However, in this op-amp, input terminals 114 and 116 are inverting terminals and input terminal 118 is a non-inverting terminal. Connected to the input terminals are input lines 120, 124 and 122 which receive the input signals $V_4$, $V_5$ and $V_0'$ respectively. The output signal $V_0'$ is supplied to inverting input terminal 116, input signal $V_4$ is supplied to inverting input terminal 114 and input signal $V_5$ is supplied to non-inverting input terminal 118. Op-amp 100 includes an amplifying portion 112 which provides an output signal to an output line 128 via an output terminal 126. A feedback line 130 is also provided which is connected to inverting input terminal 116 to provide as an input signal thereto, the output signal $V_0'$.

Figure 4:
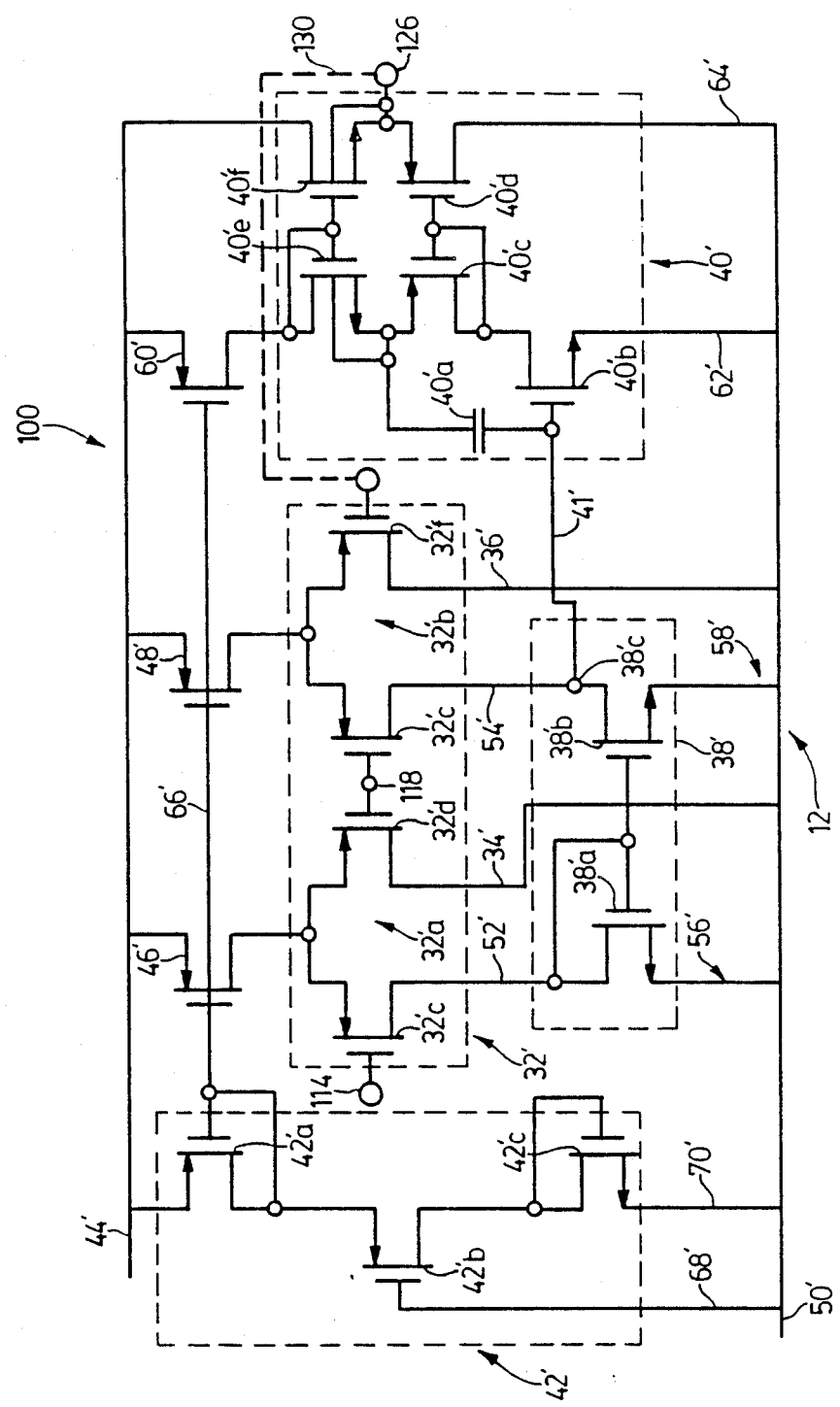
FIG. 4 is a detailed schematic circuit diagram of the amplifier illustrated in FIG. 3.

Amplifying portion 112 is similar to amplifying portion 12 illustrated in FIG. 2 except that the summing section 38' is connected to the differential section 32' in a different manner. Like reference numerals are used with like components with a prime added for clarity. To form the complementary op-amp 100, transistors 38a' and 38b' of summing section 38' are removed from conductors 34' and 36' and connected to conductors 52' and 54' in the same fashion. Similarly, conductors 34' and 36' are connected to the low voltage source 50' and conductor 41' is extended to form a connection between conductor 54' and the multiplying section 40'. Thus, the difference between the op-amp 10 and complementary op-amp 100 is the connections made between the summing section 38' and the differential section 32' therein as shown in FIG. 4.

In operation, the differential amplifiers of the op-amp 100 receive the three input signals and form therefrom output currents or difference signals $d_3$ and $d_4$ defined by the equations:

$$d_3=(V_5-V_4)*A', \text{ and } d_4=-(V_5-V_0')*A' \qquad (7)$$

wherein A' is the gain of each diff-amp.

The summing section 38' forms a sum result $S_r'$ equivalent to the difference of the difference signals $d_3$ and $d_4$ and hence the sum result is defined by the equation:

$$S_r'=(V_5-V_4)*A'+(V_5-V_0')*A' \qquad (8)$$

Similar to the op-amp 10, the multiplying section receives the sum result $S_r'$ and amplifies the result by a gain A, the gain A of which is much larger than the differential amp gains A'. Hence, the output signal $V_0'$ is applied to the inverting terminal 116 via feedback line 130 and output terminal 126 and is defined by the equation:

$$V_0'=(V_5-V_4)*A+(V_5-V_0')*A \qquad (9)$$

As can be seen, equation 9 can be rearranged to form the equation:

$$(2V_5-V_4)A=V_0'+V_0'A \qquad (10)$$

and if A is much larger than unity (i.e. A>>1), then $$V_0'=2V_5-V_4 \qquad (11)$$

Thus, if input line 120 is connected to ground ($V_4=0$), the output signal $V_0'$ will be equal to twice the input voltage signal $V_5$ applied to input line 124 and if input line 124 is connected to ground, the output signal $V_0'$ will be equal to the negative of the input signal applied to input line 120. Also, if both input signals $V_4$ and $V_5$ are equal, the output signal $V_0'$ will be equal to the value of one of the input signals $V_4$ and $V_5$. Thus, the op-amp 100 can provide gains equal to 2, −1 and 1.

It should be realized that additional differential amplifiers can be provided when the op-amp is configured in this manner to allow gains of N, −1 and 1 to be formed wherein N is a positive integer greater or equal to 2.

Thus, the present amplifier in either configuration is capable of providing gains of other than unity by implementing a feedback loop having no extraneous passive components. Furthermore, the op-amp requires only a single capacitive component which can be implemented using a passive element or a MOS gate to channel capacitance although a number of matched transistors are required. However, matched transistors are relatively easy to fabricate and thus, the present device facilitates the manufacturing process thereof using VLSI. The use of matched transistors provides another advantage in that the components of the op-amps 10 and 100 can be interleaved during fabrication. Thus, components of the op-amp which require similar operating temperatures to produce equal gains in each channel can be interleaved so that they are proximal to one another.

Although the op-amps 10 and 100 have been described using CMOS transistors it should be apparent to one skilled in the art that various transistor technologies can be used to replace the CMOS transistors. Furthermore, although matched transistors are used for each differential amplifier 32a and 32b and for the current drivers 46 and 48, it should be noted, the diff-amps can be unmatched and the associated current drivers can be altered to compensate for the channel differences in order to provide similar output signals. It should also be noted that the op-amps 10 and 100 can be provided with temperature and source voltage compensation circuitry in order to stabilize the gains thereof in the event of temperature and voltage variations. The temperature and voltage compensation circuitry, which is well known in the art, can be fabricated using the same circuit technology used in manufacturing the op-amps 10 and 100.

Since the op-amp 10 and complementary op-amp 100 can provide amplification gains of one-half and two respectively, the devices are ideal for implementation in digital to analog and analog to digital converters.

Figure 5:
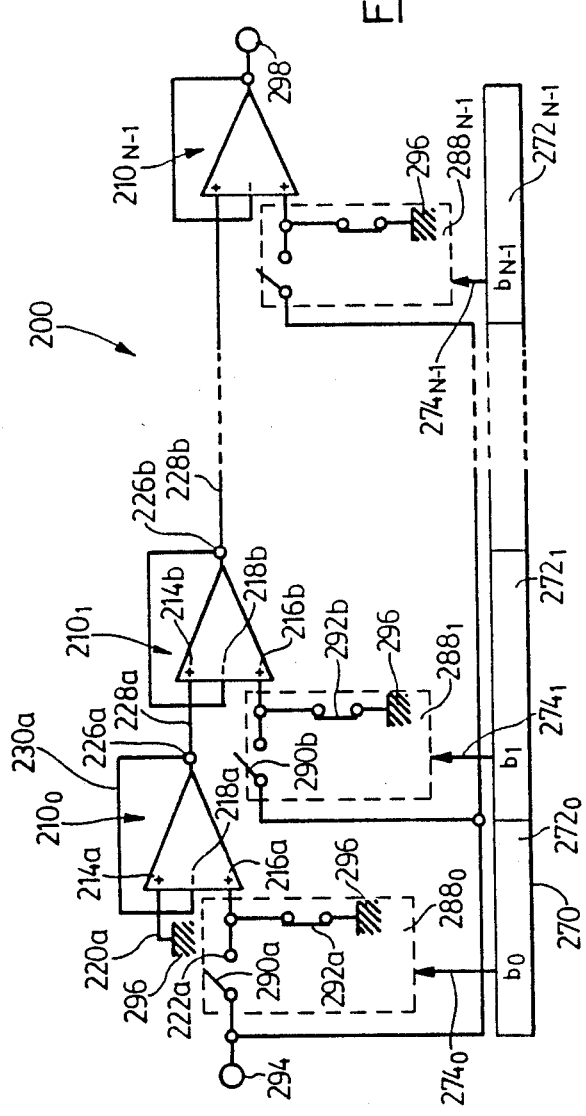
FIG. 5 is a functional block diagram of a digital to analog converter.

Referring now to FIG. 5, a unipolar digital to analog (D to A) converter 200 is shown for converting an N digit word $B_w$ of the form $(b_0, b_1, .. b_{N-1})$ into an analog voltage signal. The converter 200 comprises a plurality of cascaded op-amps $210_0$ to $210_{N-1}$, each op-amp 210 of which is configured in the manner illustrated in FIG. 2 and provides an output signal $V_0$ defined by equation 6. Furthermore, the op-amps 210 are arranged so that the first op-amp $210_0$ is associated with digit $b_0$, op-amp $210_1$, corresponds with digit $b_1$, etc. and op-amp $210_{N-1}$ corresponds with digit $b_{N-1}$.

The number of cascaded op-amps 210 required in the converter 200 is equal to the number of digits in the digital word to be converted. Op-amp $210_0$ includes input lines 220a, 222a and 224a for receiving input signals $V_1$, $V_2$ and $V_0$ respectively. Each input line is connected to a respective input terminal 214a, 216a, and 218a corresponding to the terminals 14, 16, 18 in FIG. 2. Input line 220a is connected to a ground 296 and hence, the input signal $V_1$ is equal to zero volts. Input line 222a receives a value signal depending on the value of the least significant digit $b_0$ of the word $B_w$ that is to be converted as determined by a switch network $288_0$.

Inverting terminal 218a of op-amp 210 receives an output feedback signal Vea from output terminal 226a via feedback line 230a. Terminal 226a also provides an output signal $V_0a$ to output line 228a. Input line 222a receives a signal from the switch network $288_0$ which comprises a pair of analog switches 290a and 292a, switch 290a of which is connected to a positive voltage source 294 and switch 292a of which is connected to the ground 296. The analog switches are arranged in an opposite manner such that only one switch is able to provide a connection to the non-inverting terminal 216a. Thus, when analog switch 292a is closed, switch 290a must remain open and when analog switch 290a is closed, switch 292a must remain open.

Op-amp $210_1$ receives the output signal $V_0a$ from output line 228a on non-inverting input terminal 214b and receives a feedback output signal $V_0b$ from output terminal 226b on inverting terminal 218b via feedback line 230b. Similar to op-amp $210_0$, noninverting terminal 216b is also connected to a switch network $288_1$ defined by a pair of analog switches 290b and 292b via input line 222b. Switch 290b is connected to voltage source 294 in a parallel configuration with switch 290a, and switch 292b is connected to the ground 296.

Op-amps $210_2$ to $210_{N-1}$ are arranged in the same manner as op-amp $210_1$. Thus, each op-amp $210_1$ to $210_{N-1}$ receives as input signals, the output signal $V_0$ from the preceding op-amp 210 on the non-inverting terminal 214; a feedback signal from the output terminal 226 thereof on the inverting terminal 218 and either a zero volt input signal from ground 296 or a positive voltage input signal from the voltage source 294 on input terminal 216. The input signal applied to the non-inverting terminals 216 is dependent on the orientation of the analog switches 290 and 292 connected to each op-amp stage 210.

The operation of the D to A converter 200 will now be described. When an N digit word of the form $(b_{N-1}, B_{N-2}, \ldots, b_0)$ is to be converted into an analog signal, it is applied to an N digit register 270, each stage 272 of which provides a signal to one of the switching networks 288. When a binary one is located in a register stage 272, a switching signal is generated and applied to control line 274 which causes the analog switch 290 associated with the corresponding op-amp 210 to close and the associated analog switch 292 to open. Thus, the inverting terminal 216 of each op-amp 210 associated with a digit having a logic "high" is supplied with a positive voltage input signal $V_s$ from source 294. This switching process is performed for each digit having a logic "high".

The op-amps 210 associated with binary digits having logic "lows" remain connected to the ground 296 via switches 292 and thus, receive a zero volt input signal on terminal 216. Each op-amp 210 provides an output signal $V_0$ defined by equation 6 to output line 22B. The output signal is used as a feedback signal to the same op-amp and as an input signal to the following op-amp. The output signal $V_0$ of the last stage which is used as a feedback signal and also forms the analog voltage output signal $V_A$ of the D to A converter 200.

Thus, the output signal $V_0a$ of op-amp $210_0$ is given as:

$$V_{0a} = \tfrac{1}{2} V_2.$$

Also, the output signal $V_0b$ of op-amp $210_1$ is given as $$V_{0b} = \frac{V_{0a} + V_2}{2}.$$

As can been seen, each op-amp stage provides an output signal $V_0$ equivalent to the sum of the input voltages multiplied by a factor of $\tfrac{1}{2}$.

For example, if a 4 digit word $B_w$ comprising digits $(b_3, b_2, b_1$ and $b_0)$ and being equal to the value 1011 was applied to the converter 200, the D to A converter 200 would require four op-amps, namely $210_0$ to $210_3$ and the register 270 would require 4 stages 272. After applying the word $B_w$ to the register 270, input terminals 216a, 216b and 216d would be connected to the voltage source 294 via analog switches 290a, 290b and 290d respectively, since the digits $b_0$, $b_1$ and $b_3$ corresponding to op-amps $210_0$, $210_1$ and $210_3$ are equal to one. Furthermore, analog switch 292c would remain connected to the ground 296, since digit $b_2$ is equal to zero.

If the positive voltage $V_s$ generated by source 294 were equal to 2 volts, the input signals $V_1$ and $V_2$ applied to op-amp 210a would be equal to 0 volts and 2 volts respectively since input lines 220a and 222a are connected to the ground 296 and the source 294. Thus, the output voltage $V_{0a}$ of op-amp $210_0$ would be equal to 1 volt since the output voltage which is defined by equation 6 is equal to one-half the sum of the input voltages. The input voltages $V_1$ and $V_2$ applied to op-amp $210_1$ would be equal to 1 volt and 2 volts respectively since signal $V_1$ is equal to the output voltage of op-amp $210_0$ and $V_2$ is connected to the voltage source 294. Thus, the output voltage of op-amp $210_1$ would be equal to 1.5 volts. Since the input terminal 216c of op-amp $210_2$ is grounded via switch 292c, the output voltage of op-amp $210_2$ would be equal to 0.75 volts or in other words one-half of the input signal $V_1$ applied to input line 220c. Lastly, the analog voltage output signal $V_A$ generated at the D to A converter output terminal 298 would be equal to 1.375 volts which is equivalent to $(1+\frac{3}{8}+\frac{1}{8})$ volts. It should be noted that in this system with the voltage source 294 equal to two volts, the analog voltage increment for each binary value increment is 0.125 or $\frac{1}{8}$th of a volt.

Table 1 illustrates the position of the analog switches 290 associated with each op-amp stage 210 and the analog voltage output of the D to A converter 200 for the various values of a 3 digit word $B_w$ applied thereto using a voltage source 294 equal to 2 volts.

TABLE 1

| $B_w$ | | | Switch Position | | | Output Voltage |
|---|---|---|---|---|---|---|
| $b_2$ | $b_1$ | $b_0$ | 290a | 290b | 290c | $V_A$ |
| 0 | 0 | 0 | open | open | open | 0.00 volts |
| 0 | 0 | 1 | closed | open | open | 0.25 volts |
| 0 | 1 | 0 | open | closed | open | 0.50 volts |
| 0 | 1 | 1 | closed | closed | open | 0.75 volts |
| 1 | 0 | 0 | open | open | closed | 1.00 volts |
| 1 | 0 | 1 | closed | open | closed | 1.25 volts |
| 1 | 1 | 0 | open | closed | closed | 1.50 volts |
| 1 | 1 | 1 | closed | closed | closed | 1.75 volts |

As can be seen, the voltage increment for the 3 digit D to A converter is 0.25 volts for each binary increment. Furthermore, the position of the analog switches 290a to 290c, increment in the same binary fashion as the word $B_w$ values, the open position of which is associated with a binary "0" and the closed position of which is associated with a binary "1". Thus, with the use of digital switching, the analog switches can be easily adjusted to their correct positions for each word $B_w$ to be converted.

The analog voltage output signal $V_A$ applied to the output terminal 298 can be defined by the equation:

$$V_A = V_S * \sum_{i=0}^{N-1} \frac{b_i}{2^{(N-1)}}, \text{ for } b_i = 1 \text{ or } 0, \quad (12)$$

where $b_i$ is a digit in the word $B_w$, $V_s$ is the magnitude of the voltage supplied by the voltage source 294 to each op-amp 210 stage which is associated with a digit having a value equal to 1 and N is the number digits in the word $B_w$.

Using equation 12 for the previous example where the word $B_w$ was equal to 1011, it should be realized that N is equal to 4, $V_s$ is equal to 2 volts and i is associated with the values 3, 1 and 0.

Thus, using the above values in equation 12 gives:

$$\begin{aligned} V_A &= 2 * [1/2^{(4-3)} + 1/2^{(4-1)} + 1/2^{(4-0)}] \\ &= 2[1/2 + 1/8 + 1/16] \\ &= [1 + 1/4 + 1/8] \\ &= 1.375 \text{ volts,} \end{aligned}$$

which is of course in agreement with the previous result. Thus, for a 4 digit number, the analog voltage $V_A$ increments, by a magnitude of $\frac{1}{8}$ of a volt for each binary increment.

Since, the present D to A converter 200 is formed from a series of op-amps 210 that require only a single passive component, the manufacturing process of D to A converter using VLSI is easily accomplished. Due to the configuration of the op-amp itself, each op-amp 210 in the converter 200 can be interleaved, thereby keeping components which require constant temperatures in close proximity. This lowers the probability of unequal gains in the amps due to circuit temperature variations.

Furthermore, since each op-amp 210 requires as an input, the output signal $V_0$ of the previous stage, a fault in the op-amp cascade appears as a total failure in the output of the converter 200 and thus can be detected easily unlike D to A converters which use a parallel network to supply a single op-amp. Also, since each op-amp provides an output signal equal to one-half of the input signal, noise in the system is reduced rather than being multiplied as is found in many conventional D to A converters.

Figure 6:
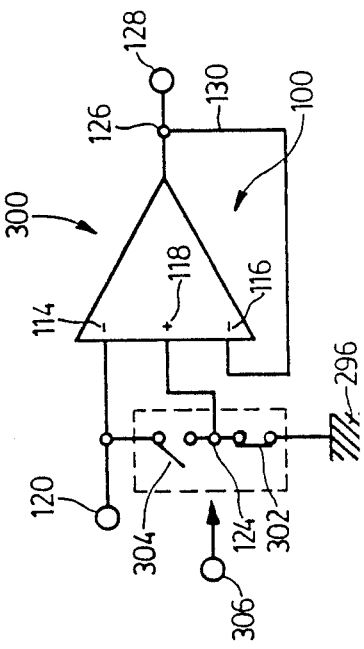
FIG. 6 is a functional block diagram of a sign bit-stage.
Figure 7:
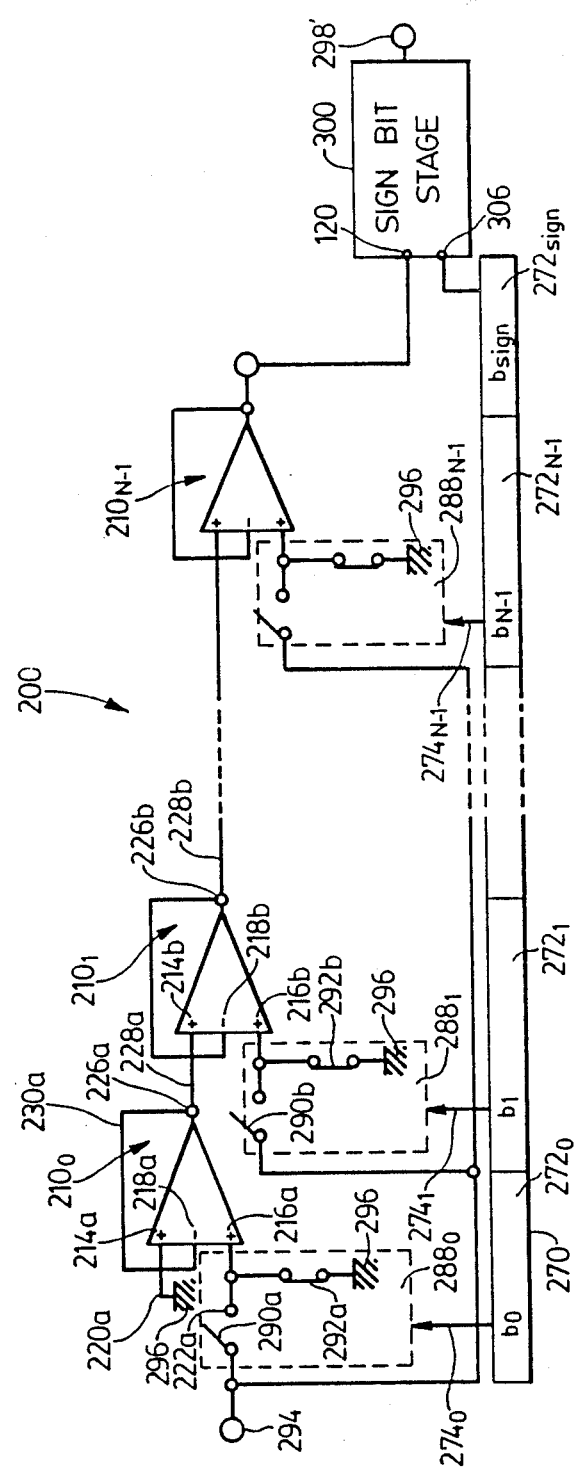
FIG. 7 is a functional block diagram of yet another digital to analog converter.

The unipolar D to A converter shown in FIG. 5 may be converted into a bipolar D to A converter 200' as shown in FIG. 7 by utilizing the complementary op-amp 100 shown in FIGS. 3 and 4 as a sign digit stage 300 as shown in FIG. 6. The sign digit stage 300 includes a single complementary op-amp 100 having inverting terminal 114 connected to an input line 120 and non-inverting terminal 118 connected to input line 124. Inverting terminal 116 is shown receiving an input signal from the output terminal 126 via feedback line 130.

The input line 124 is connected to the ground 296 via an analog switch 302. Input line 120 can also be connected to the ground 296 through an analog switch 304, the position of the switches 302 and 304 being opposite and controlled by a signal applied to a control node 306. As described previously, since the op-amp 100 is coupled in a complementary fashion, the output voltage $V_0'$ applied to the output line 128 is defined by equation 11 and hence is equal to $2V_5-V_4$ wherein $V_4$ is the input signal applied to inverting terminal 114 and $V_5$ is the input signal applied to non-inverting terminal 18.

When a signed binary word $B_w$ of the form ($b_0$, $b_1$, ..., $b_{N-1}$, $b_{sign}$) is applied to the register 270' and in turn to a D to A converter 200 having the sign digit stage 300, the sign digit $b_{sign}$ of the binary word is applied to the control node 306. If the sign of the binary word represents a negative value, a low signal is applied to control node 306 which opens analog switch 304 and closes analog switch 302. The resulting input line connections of the sign digit stage 300 provides an output signal having a gain of −1 since the input signal V5 is coupled to the ground 296 and hence is equal to zero volts. However, if the sign of the binary word represents a positive value, a high signal is applied to control node 306 thereby reversing the switch positions so that analog switch 302 is opened and analog switch 304 is closed. Thus, input terminals 114 and 118 receive the same input signal V4 from input line 120. Hence, the output voltage V0' of the sign digit stage 300 is equal to the input signal V4. Depending on the position of the switches, the sign digit stage 300 can provide an output signal V0' having a gain of either 1 or −1. Thus, with the analog voltage $V_A$ of the D to A converter applied to inverting terminal 114 of the sign bit stage 300 and the sign bit of the binary word applied to the control node 306, the polarity of the analog signal $V_A$ can be adjusted accordingly and extracted from the output node 298'. Furthermore, since the sign bit stage 300 comprises a single op-amp 100, the A to D converter 200 and the sign bit stage 300 can be integrally manufactured on a single chip to form the bipolar D to A converter 200'.

It should also be apparent that the op-amps used in the D to A converter can include more than two differential amplifiers if the factor applied to the sum of the input signals of each op-amp is desired to be a value other than ½.

Figure 8:
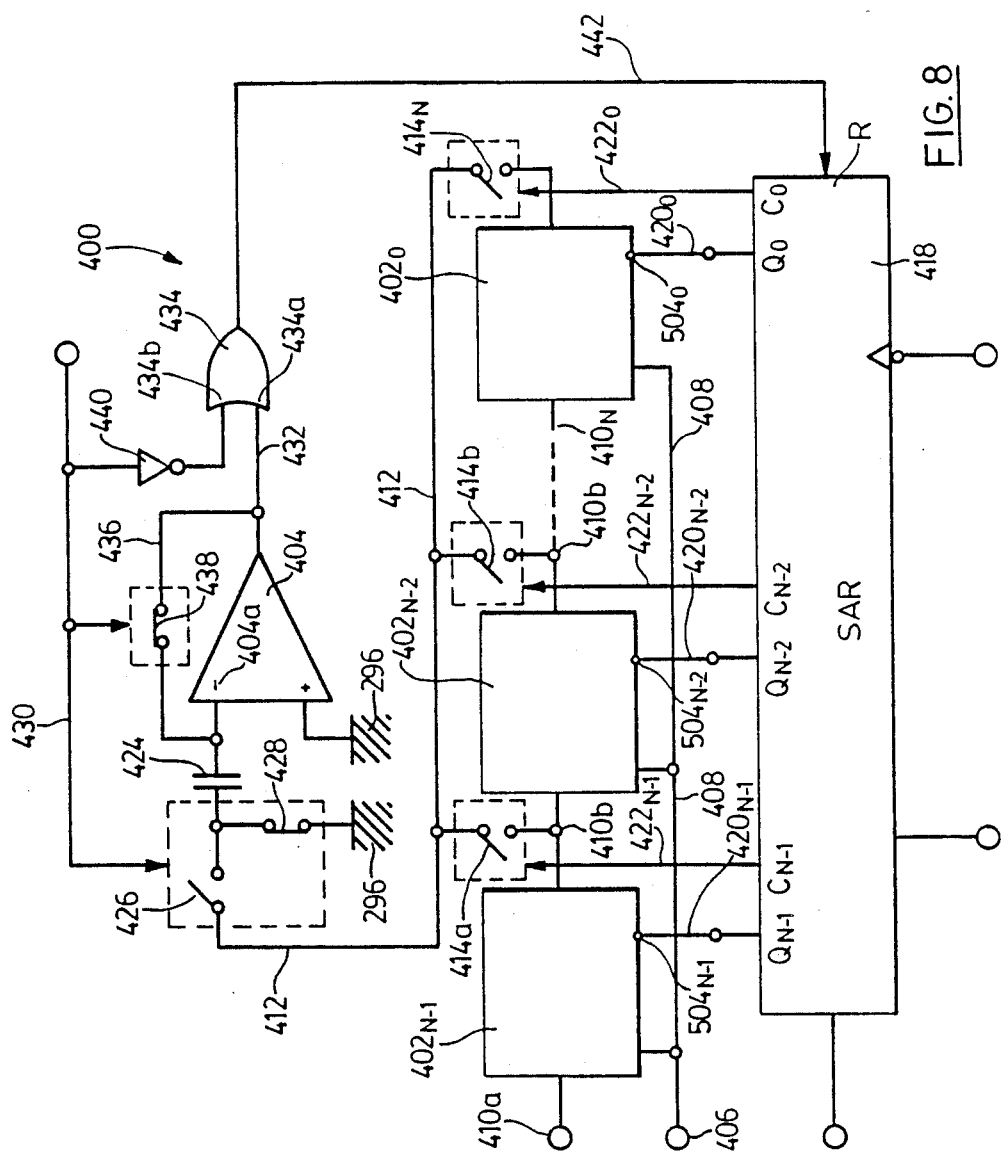
FIG. 8 is a functional block diagram of an analog to digital converter.

The present op-amp is also very useful in analog to digital conversion. Referring now to Figure 8, a sequential or algorithmic A to D converter 400 is shown for converting an analog input voltage signal $V_A$ into an N digit word $B_w$ of the form $(b_{n-1} b_2, \ldots, b_0)$. The A to D converter 400 comprises a plurality of multiplying stages $402_0$ to $402_{N-1}$ and a comparator 404. Each multiplying stage 402 is associated with the generation of one of the digits of the word. Thus, multiplying stage $402_{N-1}$ is associated with generating the most significant digit $b_{N-1}$, multiplying stage $402_{N-2}$ is associated with generating digit $b_{N-2}$ etc. and multiplying stage $402_0$ is associated with generating the least significant digit $b_0$.

Each multiplying stage 402 receives an input reference voltage signal $V_{ref}$ applied to voltage node 406 via a conductor 408. The input analog signal $V_A$ to be converted is applied to an input node 410a of the first stage $402_{N-1}$ and an appropriate output signal is generated. The output signal of the first multiplying stage $402_{N-1}$ is conveyed to the input node 410b of the second multiplying stage $402_{N-2}$ and also to a conductor 412 via an analog switch 414a. Similarly, the output of the second multiplying stage $402_{N-2}$ is applied to the input node 410c of the third multiplying stage $402_{n-3}$ and also to conductor 412 via an analog switch 414b. As can be seen each multiplying stage 402 receives as an input signal, the output signal generated by the previous stage (except for the first stage). Furthermore, each multiplying stage 402 applies the output signal generated therefrom to a common conductor 412 via an analog switch 414.

Each multiplying stage 402 also receives an input signal via conductors $420_0$ to $420_{N-1}$ from the Q pins of a successive approximation register (SAR) 418. Furthermore, each analog switch 414 receives a control signal from the C pins of the SAR 418 via conductors 422.

The conductor 412 is connected to an inverting terminal 404a of the two input terminal comparator 404 via a capacitor 424 and an analog switch 426. Connecting the conductor 412 to the ground 296 and located between the analog switch 426 and the capacitor 424 is a second analog switch 428. The position of the switches 426 and 428 is controlled by clock pulses applied to a conductor 430. The clock pulses adjust the positions of the switches so that only one of the two switches 426 and 428 is in a closed position.

The output of the comparator 404 is applied to an output line 432 which is connected to one pin 434a of an OR gate 434 and to the inverting terminal 404a via a feedback line 436 and an analog switch 438. The position of the analog switch 438 is also controlled by the clock pulses applied to conductor 430. Connected to the other pin 434b of the OR gate 434 via an inverter 440 is conductor 430. Thus, the OR gate 434 is provided with inverted clock pulse signals. The output of the OR gate 434 is conveyed to a reset pin R of the SAR 418 via a conductor 442.

Figure 9:
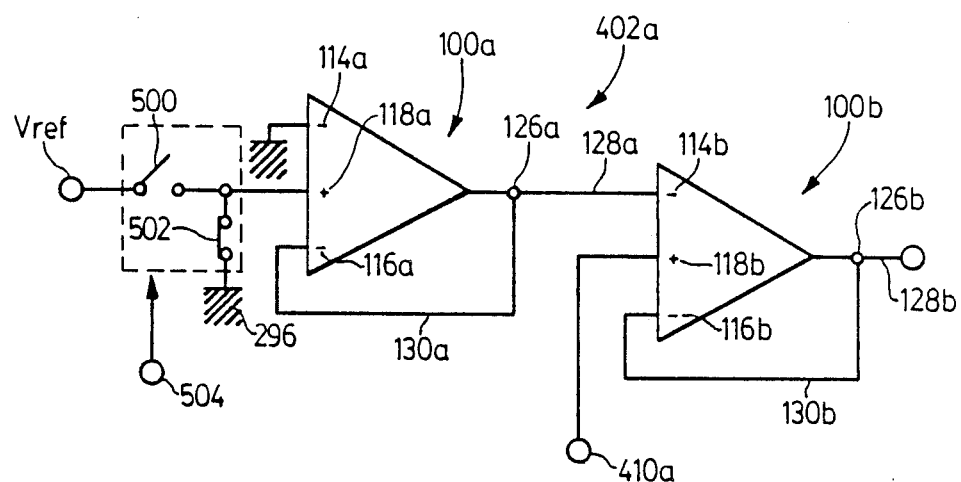
FIG. 9 is a functional block diagram of a portion of the converter illustrated in FIG. 8.

Referring now to FIG. 9, multiplying stage $402_{N-1}$ is better illustrated. It should be noted that each multiplying stage $402_{N-1}$ to $402_0$ is substantially identical and thus, FIG. 9 can refer to any of the multiplying stages. As can be seen, multiplying stage $402_{N-1}$ comprises a pair of complementary op-amps 100a and 100b similar to these shown in FIG. 3. The first op-amp 100a receives either a reference voltage signal $V_{ref}$ on non-inverting terminal 118a via an analog switch 500 or a zero volt input signal from the ground 296 via an analog switch 502. The position of the analog switches 500 and 502 are opposite and determined by a control signal applied to input node 504 from SAR 418 via conductor $42_{N-1}$. Analog switches 500 and 502 are also arranged so that only one of the two analog switches may be connected to terminal 118a.

Inverting terminal 114a of op-amp 100a is connected to the ground 296 and inverting terminal 116a is connected to the output terminal 126a via feedback line 130a. The output signal V0a' of op-amp 100a is connected to inverting terminal 114b of the second op-amp 100b via output line 128a. Similar to op-amp 100a, inverting terminal 116b of op-amp 100b receives as an input signal, the output signal V0b' via a feedback line 130b. The non-inverting terminal 118b receives the analog input voltage signal $V_A$ to be converted via conductor 410a. However, if FIG. 9 is used to represent a multiplying stage other than the first stage $402_{n-1}$, it should be noted that the input signal applied to the non-inverting terminal 118b via conductor 410 is the output signal generated by the previous multiplying stage. The output signal V0b' of op-amp 100b is applied to output line 128b via output terminal 126b and to conductor 412 via analog switch 414a if the switch is closed. Since each multiplying stage is associated with generating a digit, when the digit $b_{N-1}$ corresponding to multiplying stage $402_{N-1}$ has been generated, the output therefrom applied to conductor 410b is conveyed to the non-inverting terminal 118b of the next multiplying stage $40_{N-2}$.

The operation of the A to D converter 400 will now be described. In general, typical algorithmic A to D conversion requires two steps for the conversion of one digit. In the first step, the analog input voltage is compared to a reference voltage. If the input voltage is greater than the reference voltage, the difference between the two signals is taken and the result is multiplied by two. However, if the reference voltage is greater than the input voltage, the input voltage is multiplied by two. In either case the resulting voltage is used as the input voltage for the conversion of the next less significant digit.

The present A to D converter 400 allows the algorithmic conversion method to be implemented without the use of a large number of passive components. Initially, each pin 504 of the multiplying stages 402 is supplied with a low signal via conductor 420 from the SAR 418. Thus, switch 500 found in each stage 402 is closed thereby supplying the reference voltage $V_{ref}$ to the non-inverting terminal 118a thereof. Analog switches 414 are normally open since the C pins of the SAR 418 are usually supplied with a high signal, thereby disconnecting the output lines of each multiplying stage 402 from the conductor 412.

When an analog voltage input signal $V_A$ is received on pin 410a of multiplying stage $402_{N-1}$, it is conveyed to the non-inverting terminal 118b of op-amp 100b. The multiplying stage forms as an output signal on line 410b, a first signal equal to 2 * $(V_A - V_{ref})$. The output of the multiplying stage $402_{N-1}$ should be apparent since each amp 100a and 100b therein provides a gain as defined by equation 11.

During the conversion of the first digit $b_{N-1}$ in multiplying stage $402_{N-1}$, the control node $C_{N-1}$ generates a low voltage, thereby connecting the analog switch 414a to the conductor 412. Since the control node C outputs are generated by a shift register (not shown) in the SAR 418, the output of each control node is successively supplied with a low signal during the conversion of each successive digit. Following the generation of the output signal, the output signal is conveyed to comparator 404 via analog switches 426 and 414a. Analog switch 426 is closed upon each clock pulse being applied to conductor 430 and analog switches 428 and 438 are opened upon every clock pulse. The comparator 404 compares the magnitude of the first signal received with a zero volt reference signal received from the ground 296 on the non-inverting terminal 404b thereof and if it is less than zero, (i.e. $V_{ref} > V_A$), a pulse is applied to the reset pin R of the SAR 418 via conductor 442 and OR gate 434. In turn, the SAR 418 applies a logic high value to conductor $420_{N-1}$ via output pin $Q_{N-1}$ thereby forming the complement of the digit $b_{N-1}$ associated with multiplying stage $402_{N-1}$. The pulse applied to conductor $420_{N-1}$ opens analog switch 500 and analog switch 414a associated with multiplying stage $402_{N-1}$ thereby removing the multiplying stage $402_{N-1}$ from the voltage reference source 406 and the conductor 412.

With the reference voltage $V_{ref}$ removed from the multiplying stage $402_{N-1}$, the output thereof becomes equal to $2V_A$ since the inputs to op-amp 100a are equal to zero. Thus, in the conversion of the next digit $b_{N-2}$, the input signal that is applied to the next multiplying stage $402_{N-2}$ from the previous stage $402_{N-1}$ is equal to $2V_A$.

However, if the output signal is greater than zero (i.e. $V_A > V_{ref}$) the comparator 404 does not generate an output signal and hence, no pulse is applied to the reset pin R of the SAR 418. Thus, the output pin $Q_{N-1}$ remains low, thereby forming the complement of the digit $b_{N-1}$. The output signal $2(V_i - V_{ref})$ of the first stage $402_{N-1}$ is applied to the input pin 410b of the second stage $402_{N-2}$ which also receives a reference voltage input signal $V_{ref}$ via an analog switch 500. Multiplying stage $402_{N-2}$ forms from the input signals an output signal equivalent to $4V_i - 6V_{ref}$. Similarly, this voltage signal is applied to the comparator 404 via analog switches 426 and 414b during the conversion of the second bit $b_{N-2}$. If this signal is found to be less than zero, multiplying stage $402_{N-2}$ is removed from the reference voltage source 406 and the conductor 412. This process is performed for each multiplying stage 402 thereby setting all of the Q pins of the SAR 418 with the corresponding logic low or logic high values. To retrieve the desired word $B_w$ corresponding to the analog input voltage signal $V_A$, the complement of each Q pin is taken.

Figure 10:
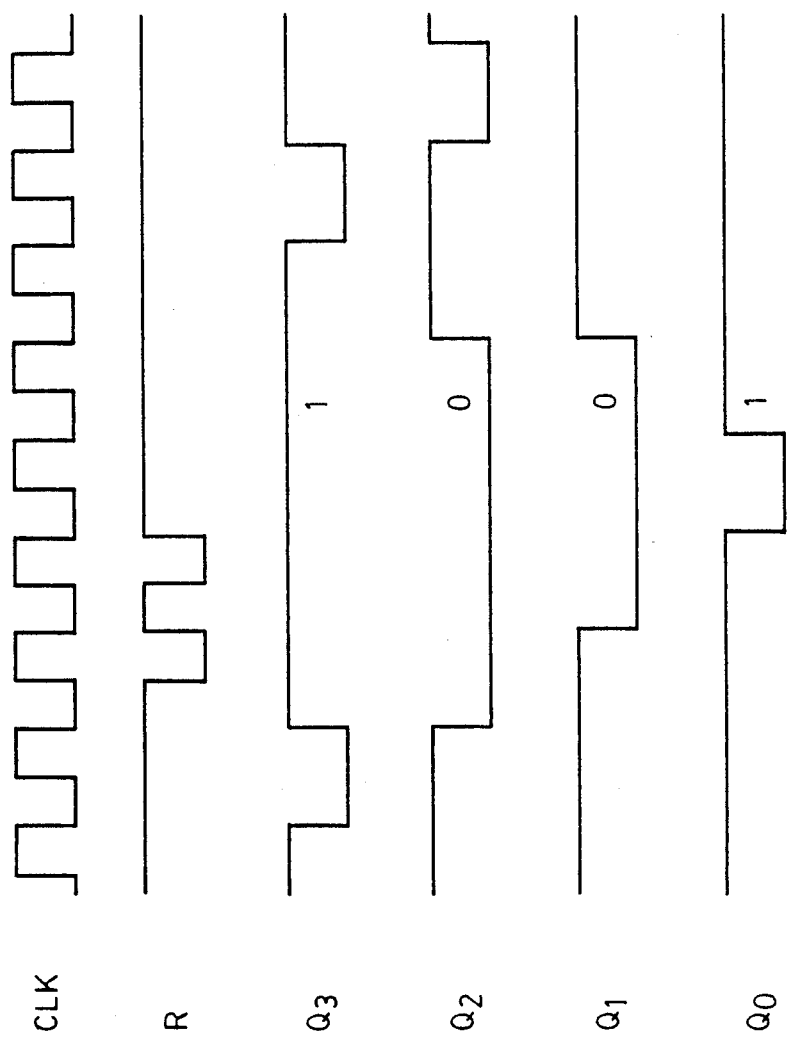
FIG. 10 illustrates timing diagrams for the device illustrated in FIG. 8.

Referring to FIG. 10, a timing diagram is shown for a 4 bit A to D converter 400 receiving for example, an analog voltage signal $V_A$ having a value which in turn would generate a binary word $B_w$ equal to 0110. Since the binary word $B_w$ is in the form $(b_3, b_2, b_1, b_0)$, the A to D converter requires 4 multiplying stages namely $402_3$, $402_2$, $402_1$, and $402_0$ respectively. If the reference voltage $V_{ref}$ supplying voltage source pin 406 was equal to 2 volts and the input analog voltage $V_A$ was equal to 1.5 volts, the A to D converter 400 would function in the following manner.

The first multiplying stage $402_3$ receives as input signals the reference voltage $V_{ref}$ and the input voltage $V_A$ and provides an output voltage at pin 410b equal to $-1$ volts. The $-1$ volt signal would be applied to comparator 404 via switches 426 and 414a and since the input signal is less than zero volts, a high signal is maintained by the OR gate 434. The resulting high signal is applied to the SAR 418, there by resetting and setting the $Q_3$ pin to a logic high value. This forms the complement of the binary bit $b_3$ and in turn disconnects switch 500 to remove multiplying stage $402_3$ from the voltage reference 406. Furthermore, after the pulse is received from the OR gate 434, the low pulse generated by the shift register on conductor $422_{N-1}$ is removed thereby removing switch 41a from conductor 412. However, the shift register applies the low pulse to control node $C_{N-2}$, which in turn connects analog switch 414b to conductor 412. With the reference source $V_{ref}$ disconnected, the output of multiplying stage $402_3$ becomes equal to $2V_a$ or in other words 3 volts.

The 3 volt output signal from stage $402_3$ as well as the 2 volt reference signal is applied to multiplying stage $402_2$ wherein an output voltage signal equal to 2 volts is generated. Similarly, this voltage signal is applied to the comparator 404. However, since the output signal is greater than zero, the output signal applied to the reset pin via the OR gate 434 drops to a low transition. This low transition prevents the $Q_2$ output pin from being set again after it has reset and thus, the output of the $Q_2$ pin remains low. With the $Q_2$ pin low, the reference voltage $V_{ref}$ on node 406 remains connected to multiplying stage $402_2$ and the complement of the binary bit $b_2$ is formed. The output of OR gate 434 which had dropped to a low value reverts back to maintain the high output signal upon reception of the next clock transition.

The 2 volt output signal from multiplying stage $402_2$ is conveyed to multiplying stage $402_1$ along with the 2 volt reference voltage $V_{ref}$ and an output voltage signal equal to 0 volts is generated therefrom. Since, this output voltage signal is not less than zero volts, the same process as described for multiplying stage $402_2$ is performed and thus, the output of pin $Q_1$ remains low, thereby forming the complement of the binary bit $b_1$.

The final or fourth stage (for a 4-bit A to D converter) receives the 0 volt input signal from multiplying stage 402 and the 2 volt reference signal $V_{ref}$ and forms therefrom a $-4$ volt output signal. Since this signal is less than zero, the same process as described for multiplying stage $402_3$ is performed and thus, the $Q_0$ pin is set to a high value, thereby forming the complement of the least significant binary bit $b_0$. To extract the correct binary word $B_w$ from the SAR 418, the value of the $\overline{Q}$ pins is extracted. In this example, the Q pins have the values 1001 and thus, the output from the $\overline{Q}$ pins forms the correct binary result of 0110.

As can be seen a cascaded series of complementary op-amps 100 provided with digitally controlled analog switches performs algorithmic A to D conversion using a minimum number of passive components since each op-amp requires only a single passive component which in fact may be implemented as another MOS device. Furthermore the comparator requires a single capacitor for offset adjustment. This allows the device to be easily implemented using VLSI and requires only a small chip area.

Figure 11:
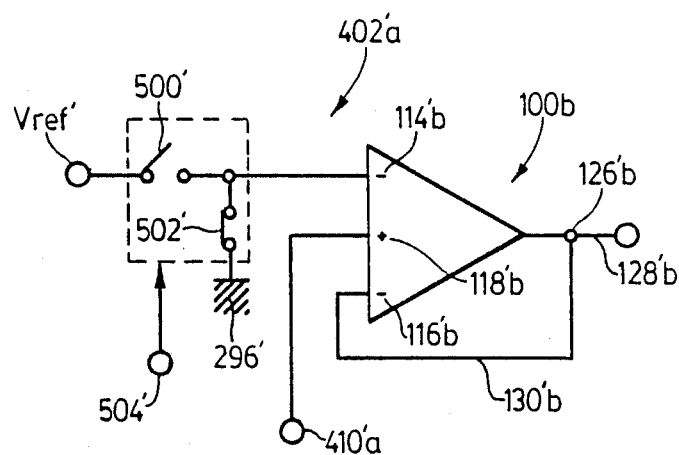
FIG. 11 is a schematic diagram of another embodiment of the portion illustrated in FIG. 9.

In a second embodiment, the multiplication stages 402 can be modified to provide the same desired output. Referring to FIG. 11, a modified multiplication stage 402' is shown comprising a single op-amp 100b'. The op-amp 100b' is identical to the op-amp 100b shown in FIG. 9, however the non-inverting terminal 114b' thereof is supplied directly with a reference voltage $V_{ref}'$ via the analog switching network 503'. The reference voltage $V_{ref}'$ is equal to $2V_{ref}$. Similar to the multiplication stage 402', the switching network 503' comprises two oppositely positioned analog switches 500' and 502' respectively, one 500' of which is connected to the voltage reference $V_{ref}'$ and the other of which is connected to the ground 296'. The switching network 503' receives a control signal from the SAR 418 via control node 504' and the analog input voltage via input terminal 410a'. The multiplication stage 402' functions in an identical manner to that of stage 402 yet provides the advantage of reducing the number of operational amplifiers required in implementing the A to D converter 400. However, when using the multiplication stage 402', a reference voltage $V_{ref}'$ having a magnitude equal to twice that of the reference voltage $V_{ref}$ is required.

It should be apparent to one skilled in the art that, the op-amps 10 and 100 can be used in a variety of applications wherever fixed gains of ½, 2, 1 and −1 are required. The op-amps can also be used to form averages of the input signals. Furthermore, the D to A and A to D converters 200 and 400 respectively can be implemented in a variety of signal conversion applications wherever a small number of passive components is desired.

We claim:

1. An operational amplifier comprising:
   at least two input terminals of one polarity and another input terminal of the opposite polarity, each of said input terminals for receiving an input signal;
   an amplifying portion receiving said input signals and performing operations thereon to form an output signal of desired gain without requiring external passive components:
   feedback means for applying as an input signal to one of said input terminals, said output signal, said amplifying portion including:
   a differential section receiving said, input signals and forming therefrom at least two difference signals; and
   logic means receiving said difference signals and performing operations thereon to provide said output signal, said output signal being equivalent to the sum of said difference signals factored by a gain.

2. The operational amplifier as defined in claim 1 wherein said logic means includes a summing section receiving said difference signals and forming therefrom a sum result; and
   amplification means for providing an amplification gain to said sum result to form said output signal.

3. The operational amplifier as defined in claim 2 wherein said differential section comprises:
   at least two differential amplifiers, each of said differential amplifiers having positive and negative polarity input nodes, the negative polarity node of each differential amplifier being interconnected to form said input terminal of opposite polarity and receiving said output signal from said feedback means, the positive polarity nodes of said differential amplifiers forming said input terminals of one polarity respectively and receiving said input signals.

4. The operational amplifier as defined in claim 2 wherein said feedback means is a low resistive connection and wherein said differential amplifiers are formed from differentially coupled transistors.

5. The operational amplifier as defined in claim 4 wherein said differential section includes N differential amplifiers and wherein said output signal is defined by the equation:

$$V_0 = \frac{\sum_{i=1}^{N} V(i)}{N}$$

wherein $V_0$ is said output signal, $V(i)$ is equal to said input signals applied to said terminals of one polarity and N is a positive integer greater or equal to 2.

6. The operational amplifier as defined in claim 5 wherein N is a positive even integer.

7. The operational amplifier as defined in claim 5 wherein said differential section includes two differential amplifiers and wherein said output signal is defined by the equation:

$$V_0 = \frac{V_1 + V_2}{2},$$

wherein $V_0$ is said output signal and $V_1$ and $V_2$ are said input signals applied to said terminals of one polarity respectively.

8. The operational amplifier as defined in claim 2 wherein said differential section includes a pair of differential amplifiers, each of said differential amplifiers having positive and negative polarity input nodes, the negative polarity node of one of said differential amplifiers receiving said output signal via said feedback means, the negative polarity node of the other of said differential amplifiers receiving a first input signal, the positive polarity nodes of each of said differential amplifiers being interconnected and receiving a second input signal.

9. The operational amplifier as defined in claim 8 wherein said feedback means is a low resistance connection and wherein said differential amplifiers are formed from a pair of coupled transistors.

10. The operational amplifier as defined in claim 9 wherein said output signal is defined by the equation $$V_0' = 2V_5 - V_x$$

wherein $V_0'$ is said output signal, $V_5$ is said second input signal and $V_x$ is said first input signal.

11. The operational amplifier as defined in claim 2 wherein said summing section comprises a pair of coupled transistors and said amplification means comprises a plurality of transistors and a single capacitive element, thereby forming a highly integratable operational amplifier.

12. The operational amplifier as defined in claim 11 wherein said pair of coupled transistors are formed from matched CMOS transistors thereby forming a current mirror.

13. The operational amplifier as defined in claim 3 wherein said differential amplifiers are formed from matched CMOS transistors, each of which is connected to a constant current source, said current sources also being formed from matched transistors.

14. The operational amplifier as defined in claim 8 wherein said differential amplifiers are formed from matched CMOS transistors, each of which is connected to a constant current source, said current sources also being formed from matched transistors.

15. A method of forming a scaled output signal from at least three input signals comprising the steps of:
receiving each of said input signals on an input terminal respectively, at least two of said input terminals being of one polarity and the other terminal being of the opposite polarity;
performing operations on said input signals to form an output signal;
applying as an input signal to one of said input terminals, said output signal, said operations comprising:
forming from said input signals at least a pair of difference signals; and
forming from said difference signals said output signal, said output signal being equivalent to the sum of said difference signals factored by a gain.

16. The method of claim 15 wherein said difference signals are firstly added to form a sum result; and
multiplying said sum result by a predetermined gain to form said output signal.

17. The method of claim 15 wherein said terminals of one polarity are non-inverting terminals, said other terminal of opposite polarity being an inverting terminal and wherein said output signal is conveyed to one of said input terminals via a low resistance connection further comprising the step of:
connecting said inverting terminal to said low resistance connection.

18. The method of claim 17 wherein said amplifier comprises two non-inverting terminals and wherein said output signal is defined by the equation:

$$V_0 = \frac{V_1 + V_2}{2},$$

wherein $V_0$ is said output signal and $V_1$ and $V_2$ are said first and second input signals respectively.

19. The method of claim 15 wherein said terminals of one polarity are inverting input terminals, said other terminal of opposite polarity being a noninverting input terminal and wherein said output signal is conveyed to be one of said input terminals via a Low resistance connection further comprising the step of:
connecting one of said terminals of one polarity to said low resistance connection.

20. The method of claim 19 wherein said amplifier comprises two inverting terminals and wherein said output signal is defined by the equation:

$$V_0' = 2V_5 - V_x$$

wherein $V_0'$ is said output signal, $V_5$ is said third input signal and $V_x$ is the other of said first and second input signals.

21. A digital to analog converter for converting an N digit number to an analog signal comprising:
a reference source for providing a reference signal;
a value source for providing a value signal for each of said N digits, said value signals being dependent on the value of said digit; and
at least N number of serially connected operational amplifiers receiving first, second and third input signals, each of said amplifiers being associated with one of said bits and providing an output signal equal to the sum of said first and second input signals factored by $1/X$ wherein X is greater of equal to 2, said output signal being applied to the preceding amplifier via an output line, each of said amplifiers comprising:
at least first and second non-inverting input terminals and a third inverting input terminal, said first terminal being connected to said value source and said second terminal being connected to said output line, except the second terminal of said first amplifier which receives said reference signal;
a differential section receiving said first, second and third input signals and forming therefrom a pair of difference signals;
logic means receiving said difference signals and performing operations thereon to provide said output signal, said output signal being equivalent to the sum of said difference signals factored by a gain; and
feedback means for connecting said output line to said third terminal.

22. The digital to analog converter as defined in claim 21 wherein said logic means includes a summing section receiving said difference signals and forming therefrom a sum result; and
amplification means for providing an amplification gain to said sum result to form said output signal.

23. The digital to analog converter as defined in claim 22 wherein each of said operational amplifiers provides an output signal equal to one-half of the sum of said first and second input signals.

24. The digital to analog converter as defined in claim 23 wherein said value source provides a positive voltage signal when said digit has a logic "high" value and a zero voltage signal when said digit has a logic "low" value.

25. The digital to analog converter as defined in claim 24 wherein said value source comprises:
N number of switching means responsive to switching signals; and
ground and positive voltage sources, each of said first terminals being connected to either said ground or said positive voltage source depending on the value of said digit.

26. The digital to analog converter as defined in claim 25 further comprising register means for receiving said binary word and storing the value of said digits, said register means providing said switching signals depending on the detected value of said digits.

27. The digital to analog converter as defined in claim 26 wherein each of said switching means includes first and second opposite polarity analog switches, said first analog switch providing a connection between said source and said first terminal upon reception of said switching signal and said second switch providing a connection between said ground and said first terminal in the absence of said switching signal.

28. The digital to analog converter as defined in claim 23 wherein said reference source is connected to ground to provide a reference signal equal to zero volts.

29. The digital to analog converter as defined in claim 28 wherein said analog output signal is defined by the equation:

$$V_A = V_S * \sum_{i=0}^{N-1} \frac{b_i}{2^{(N-i)}}, \text{ for } b_i = 1, \text{ or } 0$$

wherein $V_A$ is said analog voltage, $V_S$ is said value signal, $b_i$ is said digits and i refers to the digit position.

30. The digital to analog converter as defined in claim 26 wherein said differential section comprises:
a pair of differential amplifiers, each of said differential amplifiers including a pair of differentially coupled transistors; and
first and second input nodes, said second input node of each amplifier being interconnected to form said third input terminal and said first node forming said first and second terminals respectively.

31. The digital to analog converter as defined in claim 30 wherein said feedback means is a low resistance connection.

32. The digital to analog converter as defined in claim 23 further comprising a sign digit polarity control means for altering the polarity of said analog signal in accordance with the sign of said binary word to form a polarized analog signal comprising:
an operational amplifier having first and second inverting input terminals and a third non-inverting input terminal, each of said terminals for receiving input signals, one of said first and second input terminals receiving said analog signal;
switch means responsive to a control signal for providing said analog signal to said third input terminal, said amplifier further comprising:
an amplifying portion receiving said input signals and forming therefrom an output signal, said output signal being substantially equal to the difference between twice said third input signal and said input signal applied to said one of said first and second input terminals;
feedback means for applying as an input signal to the other of said first and second input terminals, said output signal, said amplifying portion comprising:
a differential section receiving said input signals and forming therefrom a pair of difference signals;
a summing section for forming a sum result from said difference signals; and
amplification means for providing an amplification gain to said sum result to form said polarized analog signal.

33. The digital to analog converter as defined in claim 32 further comprising second register means for storing the sign of said binary word and forming therefrom said control signal.

34. The digital to analog converter as defined in claim 33 wherein said switch means comprises first and second opposite polarity analog switches, said first switch connecting said third terminal to said one of said first and second input terminals upon reception of said control signal and said second switch connecting said third terminal to a ground in the absence of said control signal, thereby providing an output signal scaled by 1 or minus 1 respectively.

35. A sign bit polarity control means for use in a digital to analog signal converter, said sign bit polarity control means for altering the polarity of an analog signal in accordance with the sign of the corresponding binary word to form a polarized analog signal comprising:
an operational amplifier having first and second inverting input terminals and a third noninverting input terminal, each of said terminals for receiving an input signal, one of said first and second input terminals receiving said analog signal;
switch means responsive to a control signal for providing said analog signal to said third input terminal, said amplifier further comprising:
an amplifying portion receiving said input signals and forming therefrom an output signal, said output signal being substantially equal to the difference between twice said third input signal and said analog signal applied to said One of said first and second input terminals;
feedback means for applying as an input signal to the other of said first and second input terminals, said polarized analog signal, said amplifying portion comprising:
a differential section receiving said input signals and forming therefrom a pair of difference signals;
a summing section for forming a sum result from said difference signals; and
amplification means for providing an amplification gain to said sum result to form said polarized analog signal.

36. The sign bit polarity control means as defined in claim 35 further comprising register means for storing the sign of said binary word and forming therefrom said control signal.

37. The sign bit polarity control means as defined in claim 36 wherein said switch means comprises first and second opposite polarity analog switches, said first switch connecting said third terminal to said one of said first and second input terminals upon reception of said control signal and said second switch connecting said third terminal to a ground in the absence of said control signal, thereby providing an output signal scaled by 1 or minus 1 respectively.

38. A sequential analog to digital converter for converting an analog signal into an N digit word comprising:
a reference source for providing a reference signal;
at least N number of cascaded interconnected multiplying stages receiving stage input signals and forming therefrom stage output signals, each of said multiplying stage receiving as a stage input signal, the stage output signal of the preceding stage, except said first multiplying stage which receives said analog signal, each of said multiplying stages also receiving said reference signal and providing from said input signals, said stage output signals, said stage output signals being equivalent to the difference between said stage input signal and said reference signal factored by X wherein X is a positive integer greater or equal to 2, the polarity of each of said stage output signals determining the value of one digit of said binary word;

comparing means connected in parallel with said multiplying stages for comparing said stage output signals with a standard value signal to determine the polarity thereof;

register means for forming said binary digits from said detected polarity; and switch means responsive to control signals for removing said reference source and said comparing means from said multiplying stages to alter the stage output signal therefrom if the stage output signal is less than said standard value signal, said multiplying stages including at least one operational amplifier, said amplifier comprising:

at least first and second inverting input terminals and a third non-inverting input terminal, each of said terminals receiving an input signal;

a differential section receiving said input signals and forming therefrom a pair of difference signals;

logic means receiving said difference signals and performing operations thereon to provide said output signal, said output signal being equivalent to the sum of said difference signals factored by a gain; and feedback means for applying as said input signal to one of said first and second input terminals, said stage output signal.

39. The analog to digital converter as defined in claim 38 wherein said logic means includes a summing section receiving said difference signals and forming therefrom a sum result; and amplification means for providing an amplification gain to said sum result to form said output signal.

40. The analog digital converter as defined in claim 39 wherein said stage output signals are equivalent to twice the difference between the stage input signal and the reference signal.

41. The analog to digital converter as defined in claim 40 wherein said comparing means is a two input comparator one terminal of which receives said standard value signal and the other terminal of which receives said stage output signal, said one terminal being connected to the ground to provide said standard value signal having a magnitude of zero volts.

42. The analog to digital converter as defined in claim 40 wherein said switch means are N number of pairs of digitally controlled analog switches.

43. The analog to digital converter as defined in claim 40 wherein said register means is a successive approximation register and provides said control signals.

44. The analog digital converter as defined in claim 41 further comprising clocking means for providing timing signals to said register and said comparator.

45. The analog to digital converter as defined in claim 44 further comprising a plurality of switching elements, said switching elements being responsive to said clocking means for alternately engaging and disengaging said comparator from said multiplying stage upon reception of said timing signals.

46. The analog to digital converter as defined in claim 45 wherein said switching elements are digitally controlled analog switches.

47. The analog to digital converter as defined in claim 40 wherein said differential section comprises:

a pair of differential amplifiers, each of said differential amplifiers including a pair of differentially coupled transistors, and first and second input nodes, said second input nodes being coupled to form said third input terminal and said first and second nodes forming said first and second input terminals respectively.

48. The analog to digital converter as defined in claim 47 wherein said feedback means is a low resistance connection.

49. The analog to digital converter as defined in claim 40 wherein said multiplying stages comprise a single operational amplifier, one of said first and second terminals receiving said reference signal, said third terminal receiving said stage input signal and the other of said first and second terminals receiving said stage output signal.

50. The analog to digital converter as defined in claim 40 wherein said multiplying stages comprise first and second operational amplifiers, said first amplifier receiving a scaled reference signal On said third terminal, a ground signal on one of said first and second input terminals and said output signal on the other of said first and second input terminals, said amplifier forming said first output signal, said second amplifier receiving said first output signal and said stage output signal on said first and second terminals respectively and said stage input signal on said third terminal, said scaled reference signal being equal to one-half of said reference signal.

51. The analog to digital converter as defined in claim 50 wherein said scaling signal has a magnitude of zero volts and said reference signal is a positive voltage signal.

* * * * *